United States Patent
Hoag et al.

(10) Patent No.: US 6,661,023 B2
(45) Date of Patent: Dec. 9, 2003

(54) ORGANIC ELEMENT FOR ELECTROLUMINESCENT DEVICES

(75) Inventors: Benjamin P. Hoag, Rochester, NY (US); Scott R. Conley, Rochester, NY (US); Denis Y. Kondakov, Rochester, NY (US); Zbyslaw R. Owczarczyk, Webster, NY (US); Christopher T. Brown, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/183,242

(22) Filed: Jun. 27, 2002

(65) Prior Publication Data

US 2003/0201415 A1 Oct. 30, 2003

Related U.S. Application Data

(63) Continuation-in-part of application No. 10/086,085, filed on Feb. 28, 2002, now abandoned.

(51) Int. Cl.[7] .............................................. H01L 51/00
(52) U.S. Cl. ........................................ 257/40; 313/504
(58) Field of Search ........................... 257/40; 313/503, 313/504

(56) References Cited

U.S. PATENT DOCUMENTS 5,683,823 A    11/1997    Shi et al.
6,312,835 B1   11/2001    Wang et al.

FOREIGN PATENT DOCUMENTS

JP    9-7289081    11/1997
JP    9-9097180    4/1999

OTHER PUBLICATIONS

Govindarao Sathyamoorthi, et al., "Fluorescent Tricyclic β–Azavinamidine—$BF_2$ Complexes", Heteroatom Chemistry, vol. 4, No. 6, 1993, pp 603–608.

D. Basting, et al., "New Laser Dyes", Applied Physics 3, 81–88 (1974), pp. 81–88.

G. Scheibe, E. Daltrozzo, O. Worz, "Das Franck–Condon–Prinzip und die Lichtabsorption von Merocyaninen", Nov. 4, 1968, p. 103, Nr. XIX.

Primary Examiner—Sara Crane
(74) Attorney, Agent, or Firm—Arthur E. Kluegel

(57) ABSTRACT

Disclosed is an OLED device comprising a light-emitting layer containing a host and a dopant where the dopant comprises a boron compound complexed by two ring nitrogens of a deprotonated bis(azinyl)amine ligand.

59 Claims, 1 Drawing Sheet

ORGANIC ELEMENT FOR ELECTROLUMINESCENT DEVICES

CROSS-REFERENCE TO RELATED APPLICATIONS

This application is a Continuation-In-Part of copending U.S. Ser. No. 10/086,085 filed Feb. 28, 2002, the contents of which are incorporated herein by reference.

FIELD OF INVENTION

This invention relates to organic electroluminescent (EL) devices comprising a light-emitting layer containing a host and a dopant where the dopant comprises a boron compound complexed by two ring nitrogens of a deprotonated bis (azinyl)amine ligand.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965, Dresner, "Double Injection Electroluminescence in Anthracene", RCA Review, Vol. 30, pp. 322–334, 1969, and Dresner U.S. Pat. No. 3,710,167, issued Jan. 9, 1973. The organic layers in these devices, usually composed of a polycyclic aromatic hydrocarbon, were very thick (much greater than 1 $\mu$m). Consequently, operating voltages were very high, often >100V.

More recent organic EL devices include an organic EL element consisting of extremely thin layers (e.g. <1.0 $\mu$m) between the anode and the cathode. Herein, the organic EL element encompasses the layers between the anode and cathode electrodes. Reducing the thickness lowered the resistance of the organic layer and has enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610–3616, 1989]. The light-emitting layer commonly consists of a host material doped with a guest material—dopant, which results in an efficiency improvement and allows color tuning.

Since these early inventions, further improvements in device materials have resulted in improved performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others.

Notwithstanding these developments, there are continuing needs for organic EL device components, such as dopants, that will provide high luminance efficiencies combined with high color purity and long lifetimes.

A useful class of dopants is derived from the 5,6,5-tricyclic pyrromethene-BF$_2$ complexes and disclosed in U.S. Pat. No. 5,683,823; JP 09,289,081A; and JP 11,097,180A. These materials are characterized by typically narrow emission spectra, which may result in attractively high color purity. However, with the 5,6,5-tricyclic pyrromethene-BF$_2$ system the shortest known wavelength of emitted light is green. Furthermore, the green electroluminescence generated from the 5,6,5-tricyclyc pyrromethene-BF$_2$ is relatively inefficient. In order to achieve highly efficient OLEDs, one can attempt to use fused phenyl rings as substituents thereby extending conjugated $\pi$-system. As a result, however, the emission wavelength is red-shifted yielding a reddish-amber color, which is the shortest wavelength that can be emitted by 5,6,5-tricyclic pyrromethene-BF$_2$ complexes with good efficiency. Introduction of substituents has not led to efficient green or blue emitters. For example, the introduction of N at the bridging position in the 5,6,5-tricyclic boron complexes ([N-(2H-pyrro-2-ylidene-$\kappa$N)-1H-pyrrol-2-aminato-$\kappa$N$^1$] difluoroboron complexes) leads to an even further red-shift as reported by Sathyamoorthi et al. [*Heteroatom Chem*. Vol. 4 (6), Pages 603–608, 1993]. Thus, these nitrogen-bridged 5,6,5-tricyclic systems have not been used in OLED devices. It is not feasible that a blue emitter may be derived from any 5,6,5-tricyclic boron system.

It is a problem to be solved to provide a complexed-boron light-emitting dopant for the light-emitting layer of an OLED device that emits in the blue range and exhibits desirable luminance efficiency.

SUMMARY OF THE INVENTION

The invention provides an OLED device comprising a light-emitting layer containing a host and a dopant where the dopant comprises a boron compound complexed by two ring nitrogens of a deprotonated bis(azinyl)amine ligand. The invention also provides compounds and an imaging device containing the OLED device.

DETAILED DESCRIPTION OF THE INVENTION

Figure 1:
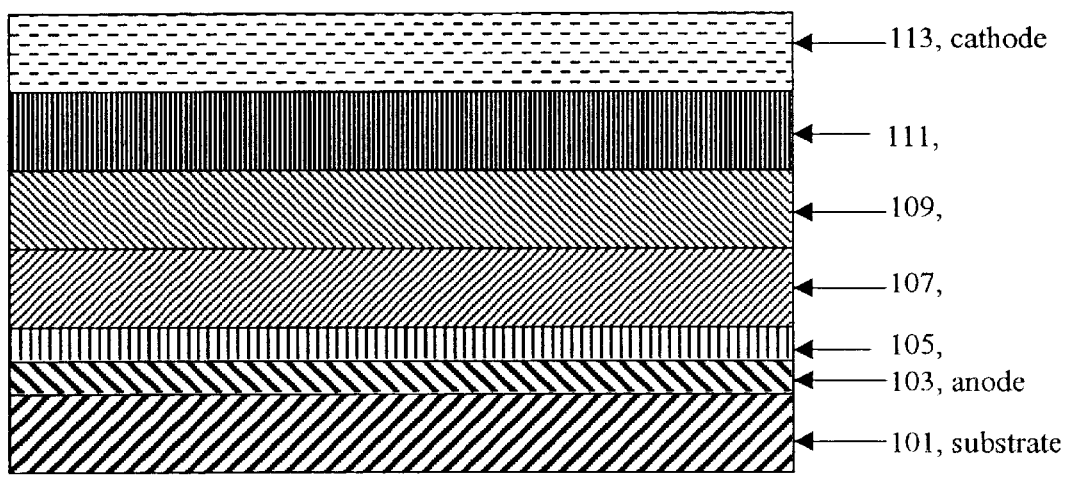
FIG. 1 shows a cross-section of a typical OLED device in which this invention may be used.

The invention is generally as described above.

An OLED device of the invention is a multilayer electroluminescent device comprising a cathode, an anode, charge-injecting layers (if necessary), charge-transporting layers, and a light-emitting layer (LEL) comprising a host and at least one dopant of a boron compound complexed by two ring nitrogens of a deprotonated bis(azinyl)amine ligand. The term azine or azinyl refers to a six-membered aromatic ring system containing at least one nitrogen as defined by the Hantzsch-Widman stems [*The Naming and Indexing of Chemical Substances for Chemical Abstracts-A Reprint of Index IV (Chemical Substance Index Names) from the Chemical Abstracts*—1992 *Index Guide;* American Chemical Society: Columbus, Ohio, 1992; paragraph 146].

Suitably, the light emitting layer of the device comprises a host and dopant where the dopant is present in an amount of up to 10 wt % of the host, more typically from 0.1–5.0 wt % of the host. The host functions as an initial energy absorber that transfers that energy to the dopant or guest material as the primary light emitter. The compound is suitably a boron compound complexed by two ring nitrogens of a deprotonated bis(azinyl)amine ligand and usefully a bis(2-pyridinyl)amine boron complex group. Good results are obtained when at least one or both of the pyridyl groups are substituted, particularly where at least one or both of the pyridyl groups has substituent groups joined to form a fused ring.

The benefit imparted by the dopant does not appear to be host specific. Desirable hosts include those based on an anthracene compound or a dicarbazole-biphenyl compound. Particular examples of hosts are 2-tert-butyl-9,10-di-(2-naphthyl)anthracene and 4,4'-N,N'-dicarbazole-1,1'-biphenyl (CBP).

Embodiments of the dopants useful in the invention provide an emitted light having a blue hue. Substituents are selected to provide embodiments that exhibit a reduced loss of initial luminance compared to the device containing no boron compound of claim 1.

The EL device of the invention is consistent with the general architecture described below and comprised of a light-emitting layer containing a dopant consistent with that depicted in formula (1):

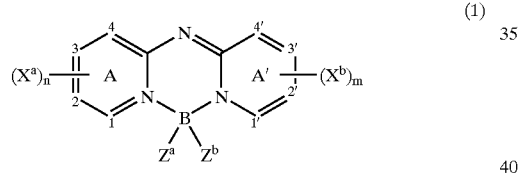

(1)

wherein

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

The EL device of the invention is desirably used as a component in a static or motion imaging device, such as a television, cell phone, DVD player, or computer monitor.

Illustrative examples of boron compounds complexed by two ring nitrogens of a deprotonated bis(azinyl)amine ligand useful in the present invention are the following:

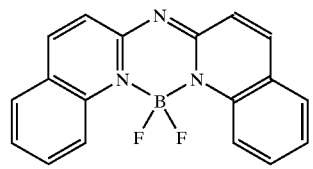

Inv-1

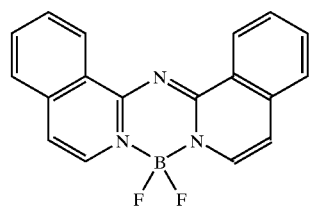

Inv-2

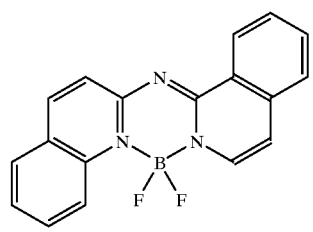

Inv-3

Inv-4

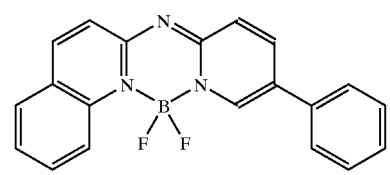

Inv-5

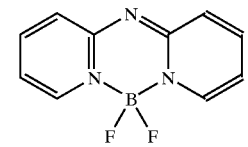

Inv-6

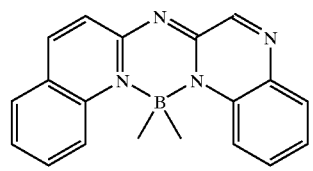

Inv-7

Inv-8

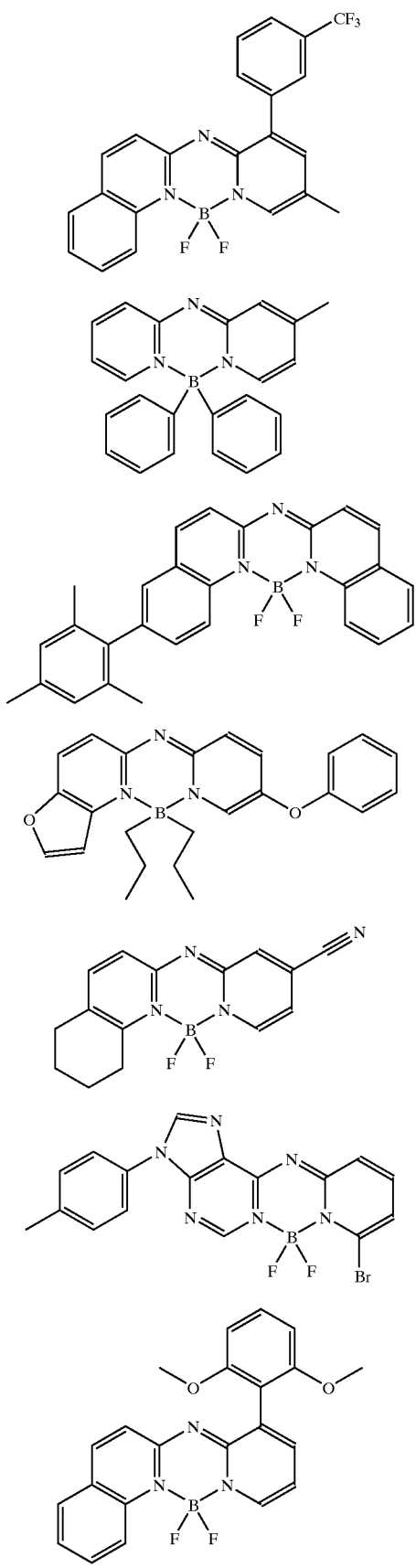
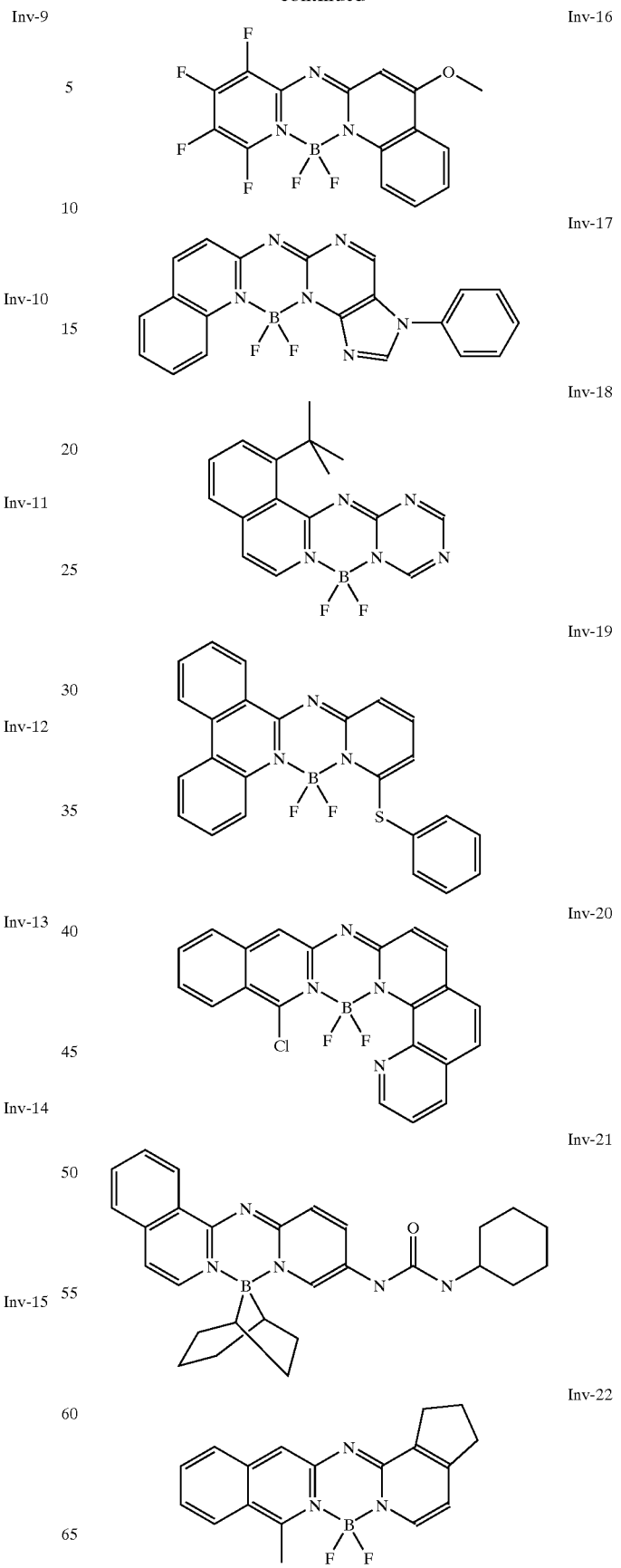

-continued

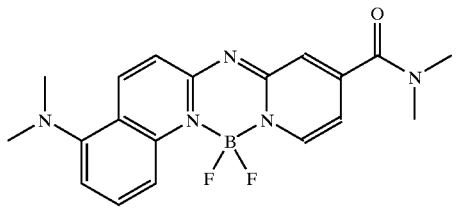
Inv-23

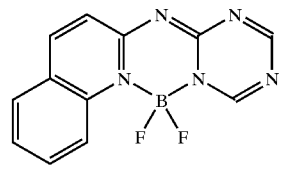
Inv-24

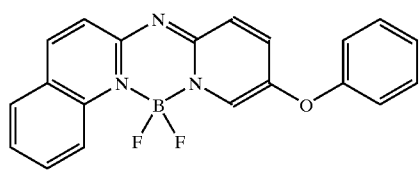
Inv-25

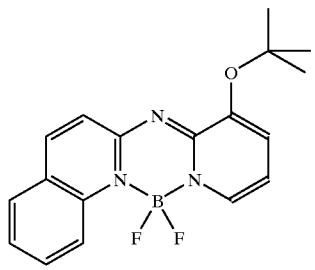
Inv-26

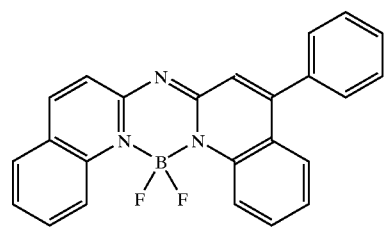
Inv-27

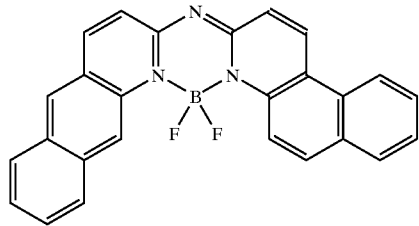
Inv-28

A desirable embodiment of the invention is consistent with the general architecture described below and comprised of a light-emitting layer containing a boron compound complexed by two ring nitrogens of a deprotonated bis(azinyl)amine ligand, wherein the two ring nitrogens are members of different 6,6 fused ring systems in which at least one of the systems contains an aryl or heteroaryl substituent group.

A preferred embodiment of the invention is consistent with the general architecture described below and comprised of a light-emitting layer containing a dopant consistent with that depicted in formula (1) above wherein A and A' represent independent azine ring systems corresponding to 6-membered aromatic ring systems containing at least one nitrogen;

each $X^a$ and $X^b$ is an independently selected substituent, two of each of which join to form rings B and B' as fused rings to rings A and A', respectively, wherein ring A, A', B, or B' comprises an aryl or heteroaryl substituent group;

m and n are independently 2 to 4;

$Z^a$ and $Z^b$ are independently selected substituents; and 1, 2, 3, 4, 1', 2', 3', and 4' are independently selected as either carbon or nitrogen atoms.

Preferred embodiments further include devices where the two fused ring systems are quinoline or isoquinoline systems; the aryl or heteroaryl substituent is a phenyl group; there are present at least two $X^a$ groups and two $X^b$ groups which join to form a 6—6 fused ring, the fused ring systems are fused at the 1-2, 3-4, 1'-2', or 3'-4' positions, respectively; one or both of the fused rings is substituted by a phenyl group; and where the dopant is depicted in formula (2), (3), or (4):

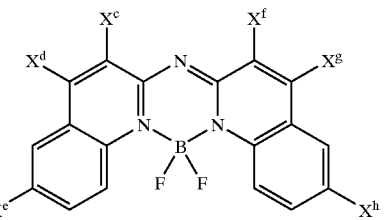
(2)

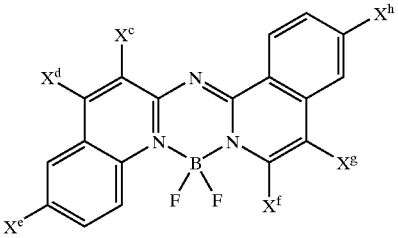
(3)

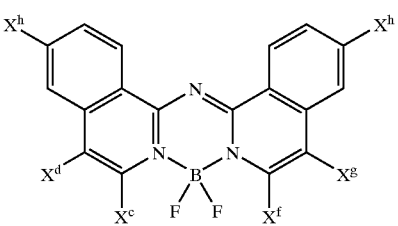
(4)

wherein each $X^c$, $X^d$, $X^e$, $X^f$, $X^g$, and $X^h$ is hydrogen or an independently selected substituent, one of which must be an aryl or heteroaryl group.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative examples of boron compounds complexed by two ring nitrogens of a deprotonated bis(azinyl)amine ligand, wherein the two ring nitrogens are members of different 6,6 fused ring systems in which at least one of the systems contains an aryl or heteroaryl substituent, useful in the present invention are the following:

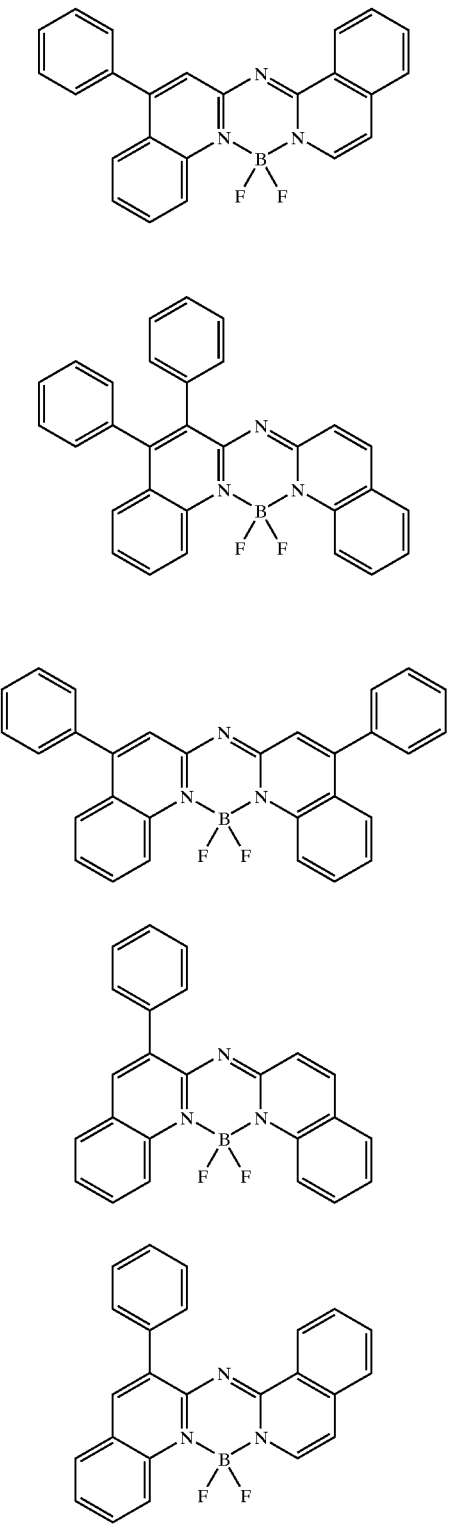

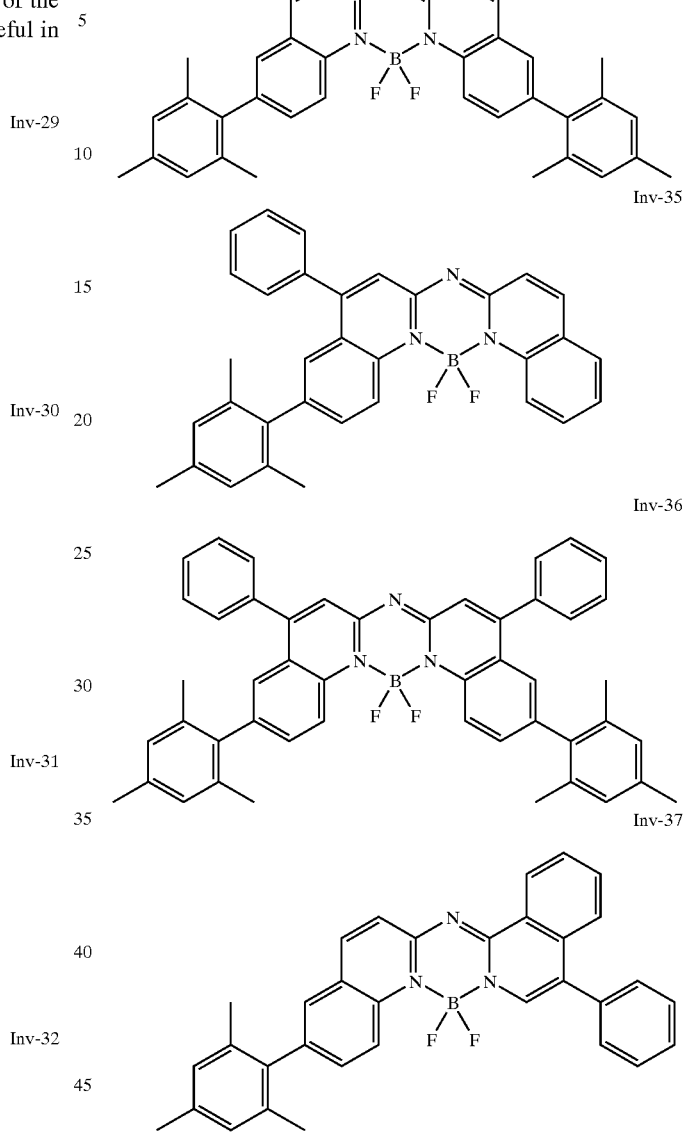

One invented compound herein is represented by Formula (1):

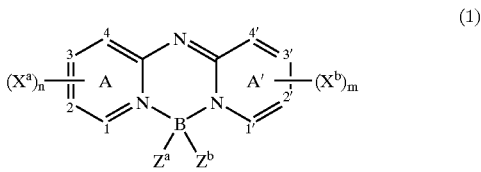

wherein

A and A' represent independent azine ring systems corresponding to 6-membered aromatic ring systems containing at least one nitrogen;

each $X^a$ and $X^b$ is an independently selected substituent, two of which join to form a fused ring group to ring A or A', respectively, and wherein the fused ring group comprises an aryl or heteroaryl substituent group;

m and n are independently 0 to 4;

$Z^a$ and $Z^b$ are independently selected halides; and 1, 2, 3, 4, 1', 2', 3', and 4' are independently selected as either carbon or nitrogen atoms.

The compound desirably provides a luminescence maximum emission in the range 400–500 nm when tested through the use of a spectrophotometer. The sample is dissolved in a suitable solvent such as ethyl acetate or methylene chloride, then excited by light at its absorbance maximum. Detection of light emitted by the sample indicates the compound is luminescent and the hue of the emitted light can be measured for maximum emission wavelength. Selection of substituents enables variation in the maximum.

A second inventive compound is also represented by Formula (1), wherein:

A and A' represent independent azine ring systems corresponding to 6-membered aromatic ring systems containing at least one nitrogen;

each $X^a$ and $X^b$ is an independently selected substituent, at least one pair of which join to form a ring fused to ring A or A' at the 3-4 or 3'-4' position;

m and n are independently 0 to 4;

$Z^a$ and $Z^b$ are independently selected halides; and 1, 2, 3, 4, 1', 2', 3', and 4' are independently selected as either carbon or nitrogen atoms.

Again, the compound desirably provides a luminescence maximum emission in the range 400–500 nm when tested as described above.

Embodiments of the invention exhibit improved hue, greater luminance yield, and a generally reduced luminance loss under load conditions.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, cyclohexyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. A typical structure is shown in FIG. 1 and is comprised of a substrate 101, an anode layer 103, an optional hole-injecting layer 105, a hole-transporting layer 107, a light-emitting layer 109, an electron-transporting layer 111, and a cathode layer 113. These layers are described in detail below. Note that the substrate may alternatively be located adjacent to the cathode, or the substrate may actually constitute the anode or cathode. Also, the total combined thickness of the organic layers is preferably less than 500 nm.

Substrate

The substrate 101 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

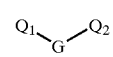

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$. or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

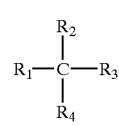

B where $R_1$ and $R_2$ each independently represents a hydrogen atom, an aryl group, or an alkyl group or $R_1$ and $R_2$ together represent the atoms completing a cycloalkyl group; and R$_3$ and R$_4$ each independently represents an aryl group, which is in turn substituted with a diaryl substituted amino group, as indicated by structural formula (C):

C wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

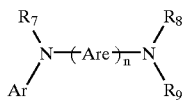

D wherein
each Are is an independently selected arylene group, such as a phenylene or anthracene moiety,
n is an integer of from 1 to 4, and
Ar, R$_7$, R$_8$, and R$_9$ are independently selected aryl groups. In a typical embodiment, at least one of Ar, R$_7$, R$_8$, and R$_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N', N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transporting materials includes polycyclic aromatic compounds as described in pending U.S. application Ser. No. 09/207,703. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. No. 4,768,292, U.S. Pat. No. 5,141,671, U.S. Pat. No. 5,150,006, U.S. Pat. No. 25 5,151,629, U.S. Pat. No. 5,405,709, U.S. Pat. No. 5,484,922, U.S. Pat. No. 5,593,788, U.S. Pat. No.

5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful host compounds capable of supporting electroluminescence, and are particularly, suitable for light emission of wavelengths longer than 500 nm, e.g., green, yellow, orange, and red.

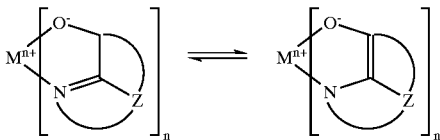

E wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

CO-10: Bis(2-methyl-8-quinolinato)-4-phenylphenolatoaluminum (III)

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

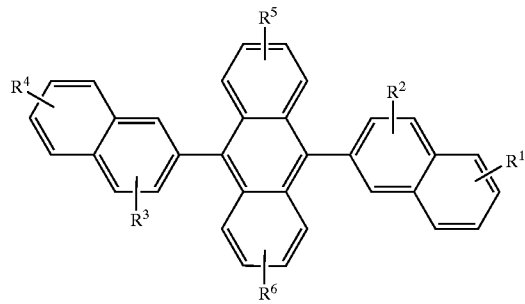

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl, Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene, and phenylanthracene derivatives as described in EP 681,019.

Benzazole derivatives (Formula G) constitute another class of useful hosts capable of supporting electroluminescence, and are particularly suitable for light emission of wavelengths longer than 400 nm, e.g., blue, green, yellow, orange or red.

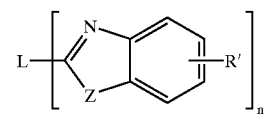

G

Where:

N is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted alyl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole]. Distyrylarylene derivatives as described in U.S. Pat. No. 5,121,029 are also useful host materials in the LEL.

Dopants represented in Formula (1) may also be used in combination with other light-emitting dopants to achieve different colors (i.e. white), increase efficiency, or increase stability. Fluorescent dopants to be used in combination with dopants represented in Formula (1) include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

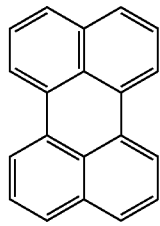

L1

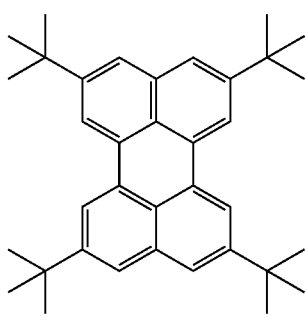

L2

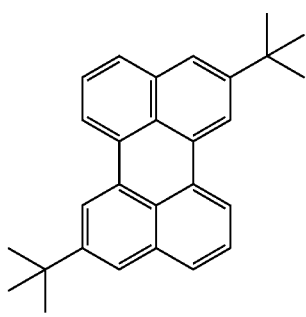

L3

-continued

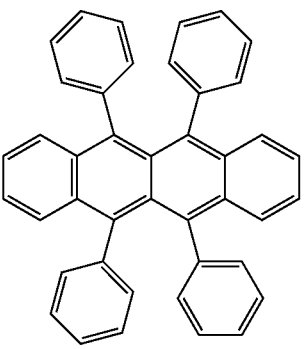

L4

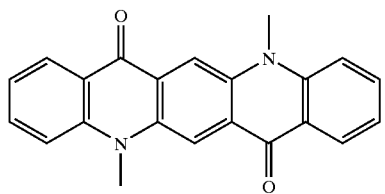

L5

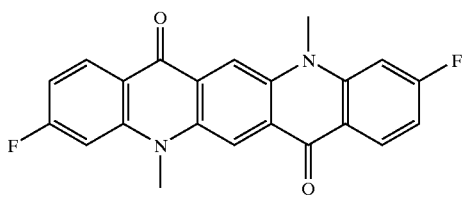

L6

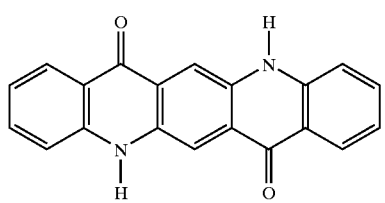

L7

L8

-continued

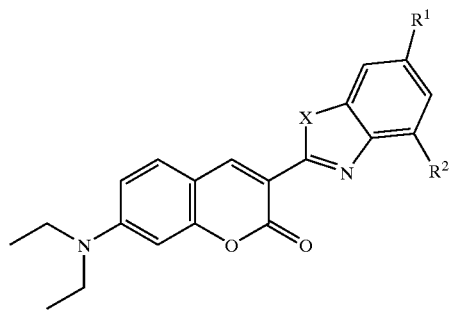

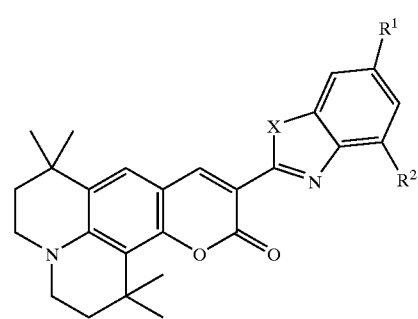

| X | R1 | R2 | | X | R1 | R2 |
|---|---|---|---|---|---|---|
| L9 | O | H | H | L23 | O | H | H |
| L10 | O | H | Methyl | L24 | O | H | Methyl |
| L11 | O | Methyl | H | L25 | O | Methyl | H |
| L12 | O | Methyl | Methyl | L26 | O | Methyl | Methyl |
| L13 | O | H | t-butyl | L27 | O | H | t-butyl |
| L14 | O | t-butyl | H | L28 | O | t-butyl | H |
| L15 | O | t-butyl | t-butyl | L29 | O | t-butyl | t-butyl |
| L16 | S | H | H | L30 | S | H | H |
| L17 | S | H | Methyl | L31 | S | H | Methyl |
| L18 | S | Methyl | H | L32 | S | Methyl | H |
| L19 | S | Methyl | Methyl | L33 | S | Methyl | Methyl |
| L20 | S | H | t-butyl | L34 | S | H | t-butyl |
| L21 | S | t-butyl | H | L35 | S | t-butyl | H |
| L22 | S | t-butyl | t-butyl | L36 | S | t-butyl | t-butyl |

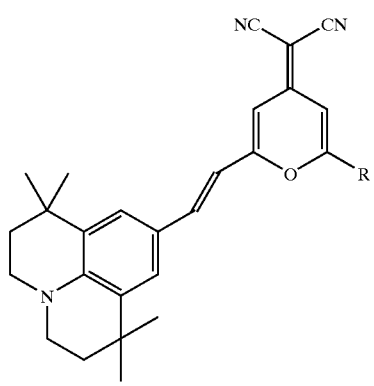

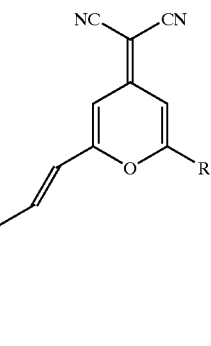

| | R | | R |
|---|---|---|---|
| L37 | phenyl | L41 | phenyl |
| L38 | methyl | L42 | methyl |
| L39 | t-butyl | L43 | t-butyl |
| L40 | mesityl | L44 | mesityl |

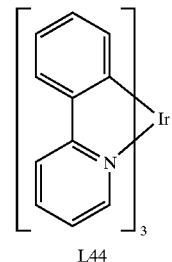

L44

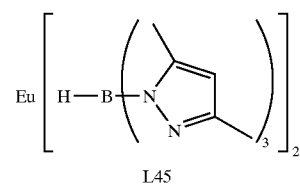

L45

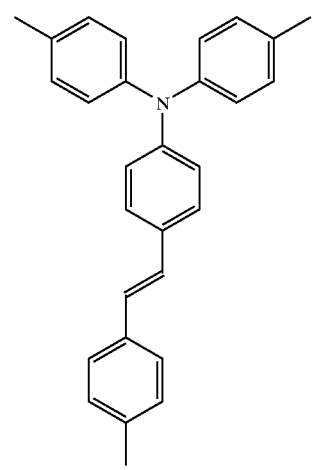

-continued

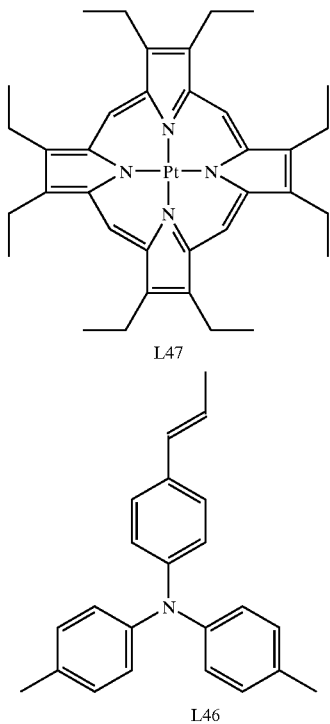

L47

L46

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. 4,539,507. Benzazoles satisfying structural formula (G) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The entire contents of the patents and other publications referred to in this specification are incorporated herein by reference.

EXAMPLES

The inventions and its advantages are further illustrated by the specific examples that follow.

Synthesis

Example 1

Preparation of Bis(1-isoquinolinyl)amine: To a 100-mL round-bottom flask were added 1-chloroisoquinoline (2.84 g, 17.3 mmol), 1-aminoisoquinoline (2.5 g, 17.3 mmol), sodium tert-butoxide (2.33 g, 24.3 mmol), palladium (II) acetate (0.16 g, 0.69 mmol), bis(2-diphenylphosphinophenyl)ether(0.35 g, 0.65 mmol), and toluene (40 mL sparged with $N_2$). The reaction mixture was heated at 105° C. for 18 h under an atm of $N_2$. The reaction mixture was diluted with ether and THF, and washed with water. This solution was passed through a pad of celite to remove insoluble particles. The organic layer was dried over $MgSO_4$ and then passed through a plug of $SiO_2$ gel eluting with $CH_2Cl_2$:$CH_3CN$ 90:10. The volatile components were removed with a rotary evaporator to afford 4.46 g (94.9%) of bis(1-isoquinolyl)amine as an olive powder. Results of $^1H$ NMR spectroscopy and electrospray mass spectroscopy are consistent with the product. $^1H$ NMR (300 MHz, $CDCl_3$): δ 6.93 (d, J=6.4 Hz, 2H), 7.63 (m, 7H), 7.71 (d, J=6.4 Hz, 2H), 9.11 (d, J=7.9 Hz, 2H).

Preparation of Difluoro[N-(2(1H)-isoquinolinylidene-κN)-2-isoquinolinaminato-κN]boron (Inv-2): To a 250-mL round-bottom flask were added bis(1-isoquinolinyl)amine, toluene, and $BF_3$ etherate. The reaction mixture was heated at reflux for 18 h and then cooled to ambient temperature. The reaction mixture was diluted with THF and ethyl acetate and washed with $H_2O$ followed by 5% NaOH solution and brine. The organic layer was dried over $MgSO_4$. Final product was isolated after column chromatography (100% $CH_2Cl_2$) as a yellow powder (4.10 g, 80.9%). The dopant was further purified by sublimation (170° C. @ 800 millitorr) with a $N_2$ carrier gas. Results of $^1H$ NMR spectroscopy are consistent with the product. $^1H$ NMR (300 MHz, $CDCl_3$): δ 7.18 (d, J=7.0 Hz, 2H), 7.69 (m, 4H), 7.79 (m, 2H), 7.89 (m, 2H), 9.16 (d, J=7.6 Hz, 2H).

Example 2

Preparation of 2-Pyridinyl-2-quinolinylamine: To a 250-mL round-bottom flask were added 2-aminopyridine (2.30 g, 24.4 mmol), 2-chloroquinoline (4.0 g, 24.4 mmol), sodium tert-butoxide (3.29 g, 34.2 mmol), palladium (II) acetate (0.22 g, 0.98 mmol), bis(2-diphenylphosphinophenyl)ether (0.49 g, 0.91 mmol), and toluene (100 mL sparged with $N_2$). The reaction mixture was heated at 105° C. for 18 h under an atm of $N_2$. The reaction mixture was diluted with ether and THF, and washed with water. This solution was passed through a pad of celite to remove insoluble particles. The organic layer was dried over $MgSO_4$. The crude product was purified by column chromatography eluting with 90:10 $CH_2Cl_2$/$CH_3CN$. 2-Pyridyl-2-quinolylamine was isolated as an olive powder (4.66 g, 86%). Results of $^1H$ NMR spectroscopy are consistent with the product. $^1H$ NMR (300 MHz, $CDCl_3$): δ 6.93 (m, 1H), 7.30 (d, J=8.8 Hz, 1H), 7.35 (t, J=7.4 Hz, 1H), 7.62 (m, 1H), 7.70 (m, 2H), 7.86 (d, J=8.4 Hz, 1H), 8.0 (m, 2H), 8.31 (m, 1H), 8.38 (d, J=8.5 Hz, 1H).

Preparation of Difluoro[N-(2(1H)-pyridinylidene-κN)-2-quinolinaminato-κN$^1$]boron (Inv-4): To a 100-mL round-bottom flask were added 2-pyridinyl-2-quinolinylamine, toluene, and $BF_3$ etherate. The reaction mixture was heated at reflux for 24 h and then cooled to ambient temperature. The reaction mixture was diluted with THF and ethyl acetate and washed with $H_2O$ followed by 5% NaOH solution and brine. The organic layer was dried over $MgSO_4$. Final product was isolated after column chromatography (95:5 $CH_2Cl_2$/$CH_3CN$) as a yellow powder (4.10 g, 70%). Results of $^1H$ NMR spectroscopy are consistent with the product. $^1H$ NMR (300 MHz, $CDCl_3$): δ 7.01 (m, 1H), 7.10 (d, J=9.1 Hz, 1H), 7.23 (d, J=8.6 Hz, 1H), 7.39 (m, 1H), 7.66 (m, 2H), 7.79 (m, 1H), 7.91 (d, J=9.0 Hz, 1H), 8.21 (m, 1H), 8.42 (m, 1H).

Example 3

EL Device Fabrication—Inventive Example

A series of EL devices satisfying the requirements of the invention were constructed in the following manner:

A glass substrate coated with a 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of $CHF_3$.
b) A hole-transporting layer of N,N'-di-1-naphthalenyl-N, N'-diphenyl-4, 4'-diaminobiphenyl (NPB) having a thickness of 75 nm was then evaporated from a tantalum boat.
c) A 30 nm light-emitting layer of 2-tert-butyl-9,10-di-(2-naphthyl)anthracene (TBADN) and Inv-1 (see Table 1 for doping level) was then deposited onto the hole-transporting layer. These materials were also evaporated from tantalum boats.
d) A 45 nm electron-transporting layer of tris(8-quinolinolato)aluminum (III) ($AlQ_3$) was then deposited onto the light-emitting layer. This material was also evaporated from a tantalum boat.
e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device was prepared omitting Inv-1 from the light-emitting layer and maintaining the same device architecture as the other examples.

The cells thus formed were tested for luminance yield and color, and the results are reported in Table I. There is a narrow, blue emission spectra peak at a wavelength of 444 nm, and there is an increase of 10–20% in luminance yield for examples 3-2 through 3-6 relative to 3-1. In addition, the majority of doped devices demonstrate greater stability than the undoped device. Example 3-2 is the only device that does not appear to offer a stability advantage over 3-1 but the stability is comparable. The best OLED device stability was demonstrated by example 3-6 with only a 37% decrease in its initial luminance after 275 hours.

TABLE I

Evaluation Results for Inv-1 in TBADN.[a]

| Example | Type | Dopant (Conc.)[1] | Yield (cd/A) | $\lambda_{max}$ (nm) | Color | % loss @ 275 h[2] |
|---|---|---|---|---|---|---|
| 3-1 | Comparison | (0.0%) | 1.50 | 460 | Blue | 55.2 |
| 3-2 | Invention | (0.2%) | 1.70 | 444 | Blue | 56.6 |
| 3-3 | Invention | (0.4%) | 1.72 | 444 | Blue | 52.9 |
| 3-4 | Invention | (0.6%) | 1.80 | 444 | Blue | 45.6 |
| 3-5 | Invention | (0.8%) | 1.66 | 444 | Blue | 39.6 |
| 3-6 | Invention | (1.0%) | 1.66 | 444 | Blue | 36.9 |
| Avg | | | 1.71 | | | 46.3 |

[a]Data reported for current density of 20 mA/cm$^2$
[1]wt % in host
[2]Stability Tests run at 70° C.

Example 4

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of $CHF_3$.

b) A hole-transporting layer of N,N'-di-1-naphthalenyl-N, N'-diphenyl-4, 4'-diaminobiphenyl (NPB) having a thickness of 75 nm was then evaporated from a tantalum boat.

c) A 30 nm light-emitting layer of 2-tert-butyl-9,10-di-(2-aphthyl)anthracene (TBADN) and Inv-5 (see Table II for doping level) was then deposited onto the hole-transporting layer. These materials were also evaporated from tantalum boats.

d) A 45 nm electron-transporting layer of tris(8-quinolinolato)aluminum (III) ($AlQ_3$) was then deposited onto the light-emitting layer. This material was also evaporated from a tantalum boat.

e) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device was prepared omitting Inv-5 from the light-emitting layer and maintaining the same device architecture as the other examples.

The cells thus formed were tested for luminance yield and color, and the results are reported in Table II. Narrow blue emission profiles are observed at 448 nm with concomitant increase of 13–24% in luminance yield relative to the undoped species. Like Example 3, the majority of doped devices demonstrate greater stability than the undoped device. OLED devices incorporating lower concentrations of Inv-5 do not offer a lifetime advantage. However, with dopant concentrations greater than 0.5%, a distinguishable advantage with regards to lifetime is observed. The best OLED device stability was demonstrated by Inventive Example 4-6 with a 43% decrease in its initial luminance at 200 hours.

TABLE II

Evaluation Results for Inv-5 in TBADN.[a]

| Example | Type | Dopant (Conc.)[1] | Yield (cd/A) | $\lambda_{max}$ (nm) | Color | % loss @ 275 h[2] |
|---|---|---|---|---|---|---|
| 4-1 | Comparison | (0.0%) | 1.56 | 456 | Blue | 51.0 |
| 4-2 | Invention | (0.2%) | 1.76 | 448 | Blue | 52.4 |
| 4-3 | Invention | (0.5%) | 1.85 | 448 | Blue | 51.1 |
| 4-4 | Invention | (0.75%) | 1.94 | 448 | Blue | 47.1 |
| 4-5 | Invention | (1.0%) | 1.89 | 448 | Blue | 45.3 |
| 4-6 | Invention | (2.0%) | 1.89 | 448 | Blue | 43.2 |
| Avg | | | 1.87 | | | 47.8 |

[a]Data reported for current density of 20 $mA/cm^2$
[1]wt % in host
[2]Stability Tests run at 70° C.

Example 5

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of $CHF_3$.

b) A hole-transporting layer of N,N'-di-1-naphthalenyl-N, N'-diphenyl-4, 4'-diaminobiphenyl (NPB) having a thickness of 75 nm was then evaporated from a tantalum boat.

c) A 30 nm light-emitting layer of 4,4'-N,N'-dicarbazole-1,1'-biphenyl (CBP) and Inv-1 (see Table III for doping level) was then deposited onto the hole-transporting layer. These materials were also evaporated from tantalum boats.

d) A 15 nm hole-blocking layer of bis(2-methyl-8-quinolinato)-4-phenylphenolatoaluminum (III) was then deposited onto the light-emitting layer. This material was also evaporated from a tantalum boat.

e) A 30 nm electron-transporting layer of tris(8-quinolinolato)aluminum (III) ($AlQ_3$) was then deposited onto the hole-blocking layer. This material was also evaporated from a tantalum boat.

f) On top of the $AlQ_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device was prepared omitting Inv-1 from the light-emitting layer and maintaining the same device architecture as the other examples.

This series of electroluminescent devices was fabricated to demonstrate the capability of the boron complex to serve as a blue dopant in a variety of hosts. There is effective energy transfer from the host, CBP, to the dopant, Inv-1. Emission wavelength maximum shifts from 472 nm (emission due to bis(2-methyl-8-quinolinato)-4-phenylphenolatoaluminum (III)) to 444 nm (emission due to Inv-1), and the narrow emission profile is again similar to the emission profile of Inv-1 in solution. The luminance yield is also increased upon addition of Inv-1 by 15–40%.

TABLE III

Evaluation Results for Inv-1 in CBP.[a]

| Example | Type | Dopant (Conc.)[1] | Yield (cd/A) | $\lambda_{max}$ (nm) | Color |
|---|---|---|---|---|---|
| 5-1 | Comparison | (0.0%) | 1.56 | 472 | Blue |
| 5-2 | Invention | (0.2%) | 2.18 | 444 | Blue |
| 5-3 | Invention | (0.4%) | 2.08 | 444 | Blue |
| 5-4 | Invention | (0.6%) | 2.09 | 444 | Blue |
| 5-5 | Invention | (0.8%) | 2.10 | 444 | Blue |
| 5-6 | Invention | (1.0%) | 1.80 | 444 | Blue |
| Avg | | | 2.05 | | |

[a]Data reported for current density of 20 $mA/cm^2$
[1]wt % in host

Example 6

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of $CHF_3$.

b) A hole-transporting layer of N,N'-di-1-naphthalenyl-N, N'-diphenyl-4, 4'-diaminobiphenyl (NPB) having a thickness of 75 nm was then evaporated from a tantalum boat.

c) A 30 nm light-emitting layer of 2-tert-butyl-9,10-di-(2-naphthyl)anthracene (TBADN) and Inv-2 (see Table IV for doping level) was then deposited onto the hole-transporting layer. These materials were also evaporated from tantalum boats.

d) A 45 nm electron-transporting layer of tris(8-quinolinolato)aluminum (III) (AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device was prepared omitting Inv-2 from the light-emitting layer and maintaining the same device architecture as the other examples.

The cells thus formed were tested for luminance yield and color, and the results are reported in Table IV. Narrow blue emission profiles are observed at 464 nm with concomitant increase of 7–15% in luminance yield relative to the undoped species. All doped devices demonstrate greater stability than the undoped device, exhibiting a modestly smaller luminance loss over 200 h.

TABLE IV

Evaluation Results for Inv-2 in TBADN.[a]

| Example | Type | Dopant (Conc.)[1] | Yield (cd/A) | $\lambda_{max}$ (nm) | Color | % loss @ 200 h[2] |
|---|---|---|---|---|---|---|
| 6-1 | Comparison | (0.0%) | 1.42 | 460 | Blue | 33.6 |
| 6-2 | Invention | (0.25%) | 1.55 | 464 | Blue | 28.8 |
| 6-3 | Invention | (0.5%) | 1.61 | 464 | Blue | 31.8 |
| 6-4 | Invention | (0.75%) | 1.52 | 464 | Blue | 32.6 |
| 6-5 | Invention | (2.0%) | 1.64 | 468 | Blue | 28.8 |
| Avg | | | 1.58 | | | 30.5 |

[a]Data reported for current density of 20 mA/cm$^2$
[1]wt % in host
[2]Stability Tests run at 70° C.

Example 7

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer CFx) by plasma-assisted deposition of CHF$_3$.

b) A hole-transporting layer of NN'-di-1-naphthalenyl-N,N'-diphenyl-4, 4'-diaminobiphenyl (NPB) having a thickness of 75 nm was then evaporated from tantalum boat.

c) A 30 nm light-emitting layer of 2-tert-butyl-9,10-di-(2-naphthyl)anthracene (TBADN) and Inv-3 (see Table V for doping level) was then deposited onto the hole-transporting layer. These materials were also evaporated from tantalum boats.

d) A 45 nm electron-transporting layer of tris(8-quinolinolato)aluminum (III) (AlQ$_3$) was then deposited onto the light-emitting layer. This material was also evaporated from a tantalum boat.

e) On top of the AlQ$_3$ layer was deposited a 220 nm cathode formed of a 10:1 volume ratio of Mg and Ag.

The above sequence completed the deposition of the EL device. The device was then hermetically packaged in a dry glove box for protection against ambient environment.

A comparison device was prepared omitting Inv-3 from the light-emitting layer and maintaining the same device architecture as the other examples.

The cells thus formed were tested for luminance yield and color, and the results are reported in Table V. Narrow blue emission profiles are observed at 472 nm with a concomitant increase of 13–21% in luminance yield relative to the undoped species. All doped devices demonstrate greater stability than the undoped device. The best OLED device stability was demonstrated by Inventive Example 7-6 with a 20% decrease in its initial luminance at 200 hours.

TABLE V

Evaluation Results for Inv-3 in TBADN.[a]

| Example | Type | Dopant (Conc.)[1] | Yield (cd/A) | $\lambda_{max}$ (nm) | Color | % loss @ 200 h[2] |
|---|---|---|---|---|---|---|
| 7-1 | Comparison | (0.0%) | 1.51 | 464 | Blue | 44.4 |
| 7-2 | Invention | (0.25%) | 1.71 | 472 | Blue | 22.3 |
| 7-3 | Invention | (0.5%) | 1.78 | 472 | Blue | 24.7 |
| 7-4 | Invention | (0.75%) | 1.83 | 472 | Blue | 25.2 |
| 7-5 | Invention | (1.0%) | 1.73 | 472 | Blue | 22.9 |
| 7-6 | Invention | (2.0%) | 1.81 | 472 | Blue | 20.4 |
| Avg | | | 1.77 | | | 23.1 |

[a]Data reported for current density of 20 mA/cm$^2$
[1]wt % in host
[2]Stability Tests run at 70° C.

Example 8

Preparation of 4-phenyl-2-aminoquinoline: Acetonitrile (150 mL) was heated to reflux for 30 minutes in the presence of potassium hydroxide (14.2 g, 254 mmol). 2-aminobenzophenone (10.0 g, 50.7 mmol) in acetonitrile (165 mL) was added to the reaction mixture. After heating to reflux overnight, the mixture was cooled to room temperature, and the resulting solid was filtered. HCl (1.0 M, 100 mL) was added to the solution, and the resulting solid was filtered. The solids were combined, dissolved in ethyl acetate, dried over magnesium sulfate, and filtered. The volatile components were removed with a rotary evaporator, and the solid was recrystallized from ethyl acetate and heptane.

Preparation of 4-phenyl-2-quinolinyl-2'-quinolinyl amine: To a round-bottom flask were added 4-phenyl-2-aminoquinoline (2.0 g, 9.1 mmol), 2-chloroquinoline (1.5 g, 9.1 mmol), palladium (II) acetate (0.08 g, 0.36 mmol), bis(2-diphenylphosphinophenyl)ether (0.18 g, 0.34 mmol), sodium tert-butoxide (1.0 g, 10.9 mmol) and toluene (18 mL sparged with N$_2$). The reaction mixture was heated at 90° C. for 5 h under an atm of N$_2$. The reaction mixture was filtered and the solid collected. The volatile components were removed with a rotary evaporator, and the mixture was dissolved in ethyl acetate and methylene chloride. HCl (3 M, drops) was added to the mixture until a solid formed. The mixture was filtered and the solid was collected. Preparation of Inv-27: To a round-bottom flask were added 4-phenyl-2-quinolinyl-2'-quinolinyl amine (1.2 g, 3.4 mmol), toluene (35 mL), and BF$_3$-etherate (0.88 mL, 6.9 mmol). The reaction mixture was heated at reflux for 18 h and then cooled to ambient temperature. The reaction mixture was diluted with H$_2$O and extracted with methylene chloride. The mixture was dried over magnesium sulfate, and filtered. The volatile components were removed with a rotary evaporator, and the solid was recrystallized from ethyl acetate and heptane. The dopant was further purified by sublimation.

Example 9

A series of EL devices satisfying the requirements of the invention were constructed in the manner illustrated in Example 3 except the dopant used is shown in Table VI. The cells thus formed were tested for luminance yield, color, and luminance loss under load conditions; and the results are reported in Table VI. As a desirable embodiment of the invention, the results for the different dopants show high luminance yield, good color, and good stability.

TABLE VI

Evaluation Results for dopants in TBADN.[a]

| Dopant | Dopant (Conc.)[1] | Yield (cd/A) | $\lambda_{max}$ (nm) | Color | % loss @ 200 h[2] |
|---|---|---|---|---|---|
| Inv-27 | 1.0% | 2.27 | 452 | blue | 26.8% |
| Inv-29 | 1.0% | 2.18 | 456 | blue | 11.9% |
| Inv-32 | 1.0% | 2.47 | 452 | blue | 32.4% |
| Inv-35 | 1.0% | 2.63 | 456 | blue | 24.0% |

[a]Data reported for current density of 20 mA/cm$^2$
[1]wt % in host
[2]Stability Tests run at 70° C.

Example 10

A series of EL devices satisfying the requirements of the invention were constructed in the manner illustrated in Example 3 except the thickness of the electron-transporting layer of tris(8-quinolinolato)aluminum (III) (AlQ$_3$) is 35 nm, the light-emitting layer of 2-tert-butyl-9,10-di-(2-naphthyl)anthracene (TBADN) is 20 nm thick, and the dopant is shown in Table VII. The cells thus formed were tested for luminance yield, color, and luminance loss under load conditions; and the results are reported in Table VII. As a desirable embodiment of the invention, the results for the different dopants show high luminance yield, good color, and good stability.

TABLE VII

Evaluation Results for dopants in TBADN.[a]

| Dopant | Dopant (Conc.)[1] | Yield (cd/A) | $\lambda_{max}$ (nm) | Color | % loss @ 200 h[2] |
|---|---|---|---|---|---|
| Inv-27 | 1.0% | 1.65 | 448 | blue | 22.3% |
| Inv-29 | 1.0% | 1.97 | 452 | blue | 16.8% |
| Inv-34 | 1.0% | 2.39 | 452 | blue | 28.0% |

[a]Data reported for current density of 20 mA/cm$^2$
[1]wt % in host
[2]Stability Tests run at 70° C.

Example 11

A series of EL devices satisfying the requirements of the invention were constructed in the manner illustrated in Example 3 except the thickness of the electron-transporting layer of tris(8-quinolinolato)aluminum (III) (AlQ$_3$) is 40 nm, the light-emitting layer of 2-tert-butyl-9,10-di-(2-naphthyl)anthracene (TBADN) is 20 nm thick, and the dopant is shown in Table VIII. The cells thus formed were tested for luminance yield, color, and luminance loss under load conditions; and the results are reported in Table VIII. As a desirable embodiment of the invention, the results for the different dopants show high luminance yield, good color, and good stability.

TABLE VIII

Evaluation Results for dopants in TBADN.[a]

| Dopant | Dopant (Conc.)[1] | Yield (cd/A) | $\lambda_{max}$ (nm) | Color | % loss @ 200 h[2] |
|---|---|---|---|---|---|
| Inv-30 | 1.0% | 1.48 | 448 | blue | 42.1% |
| Inv-31 | 1.0% | 2.12 | 456 | blue | * |
| Inv-32 | 1.0% | 1.66 | 452 | blue | 22.8% |
| Inv-33 | 1.0% | 2.05 | 448 | blue | 17.7% |
| Inv-36 | 1.0% | 2.96 | 464 | blue | 22.0% |
| Inv-37 | 1.0% | 3.37 | 464 | blue | 19.0% |

[a]Data reported for current density of 20 mA/cm$^2$
[1]wt % in host
[2]Stability Tests run at 70° C.
*Testing not completed due to premature device short.

The examples described above illustrate that the class of boron complexes coordinated through the ring nitrogens of a bis(azinyl)amine as described earlier may serve as organic dopants capable of producing highly efficient blue electroluminescence. It is important to again differentiate this class of dopants from structurally similar tricyclic boron complexes employing 5-membered rings and those yielding a green hue. Comparative examples are given in Table IX.

Although minor perturbations to the emission $\lambda_{max}$ are expected from different substituents, the large differences in emission maxima (>75 nm) are attributed to the different central ring structures of the chromophores. A hypsochromic shift of 90 nm occurs when N is substituted for -CH as the bridging moiety between the two quinoline heterocycles (8-1 vs. 8-2). The opposite effect is seen in the analogous 5,6,5-tricyclic boron complexes as reported by Sathyamoorthi et al. [*Heteroatom Chem.* Vol. 4 (6), Pages 603–608, 1993]; when N is substituted as the bridging moiety between the two pyrrole rings, a bathochromic shift of roughly 100 nm results (8-4 vs. 8-3). This wide range of emission maxima illustrates the very different electronic properties of these seemingly similar structures. It is worth noting that none of the comparative examples are capable of generating blue light. Only inventive example 8-1 is capable of blue emission, thus demonstrating the significance of the particular boron complex useful in the invention and its importance to EL devices.

TABLE IX

Comparison of Tricyclic Boron Complexes.

| Example | Type | Structure | $\lambda_{max}$[1] |
|---|---|---|---|
| 8-1 | Invention | | 430 (blue) |
| 8-2 | Comparison | | 520 (green) |
| 8-3 | Comparison | | 590 (orange) |
| 8-4 | Comparison | | 696 (deep red) |

[1]Solution fluorescence.

The invention has been described in detail with particular reference to certain preferred embodiments thereof, but it will be understood that variations and modifications can be effected within the scope of the invention.

Parts list 101 substrate
103 anode
105 hole-injecting layer (HIL)
107 hole-transporting layer (HTL)
109 light-emitting layer (LEL)
111 electron-transporting layer (ELT)
113 cathode

What is claimed is:

1. An OLED device comprising a light-emitting layer containing a host and a dopant where the dopant comprises a boron compound complexed by two ring nitrogens of a deprotonated bis(azinyl)amine ligand.

2. The device of claim 1 wherein the dopant is present in an amount of up to 10 wt % of the host.

3. The device of claim 1 wherein the dopant is present in an amount of 0.1–5.0 wt % of the host.

4. The device of claim 1 wherein the azinyl group is a pyridyl group.

5. The device of claim 5 wherein at least one of the pyridyl groups is substituted.

6. The device of claim 5 wherein at least one of the pyridyl groups has substituent groups joined to form a fused ring.

7. The device of claim 1 wherein the host comprises a chelated oxinoid compound, a dicarbazole-biphenyl compound, or an anthracene compound.

8. The device of claim 7 wherein the host comprises a chelated oxinoid compound.

9. The device of claim 7 wherein the host comprises a dicarbazole-biphenyl compound.

10. The device of claim 7 wherein the host comprises an anthracene compound.

11. The device of claim 1 wherein the host comprises 4,4'-N,N'-dicarbazole-1,1'-biphenyl (CBP) or 2-tert-butyl-9,10-di-(2-naphthyl)anthracene.

12. The device of claim 1 wherein the substituents are selected to provide an emitted light from the dopant having a blue hue.

13. The device of claim 1 wherein the substituents are selected to provide a reduced loss of luminance with time under load compared to the loss from the same device containing no boron compound of claim 1.

14. The device of claim 1 wherein the dopant compound is represented by Formula (1):

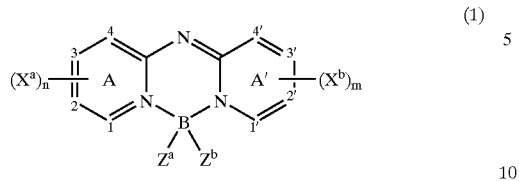

wherein

A and A' represent independent azine ring systems corresponding to 6-membered aromatic ring systems containing at least one nitrogen;

each $X^a$ and $X^b$ is an independently selected substituent, two of which may join to form a fused ring group to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

15. The device of claim 14 wherein 1, 2, 3, 4, 1', 2', 3', and 4' are all carbon atoms.

16. The device of claim 14 wherein at least one of ring A or A' contains substituents joined to form a fused ring.

17. The device of claim 14 wherein both ring A and A' contain substituents joined to form a fused ring.

18. The device of claim 14 wherein there is present at least one $X^a$ or $X^b$ group selected from the group consisting of halide and alkyl, aryl, alkoxy, and aryloxy groups.

19. The device of claim 14 wherein $Z^a$ and $Z^b$ are independently selected from the group consisting of fluoro and alkyl, aryl, alkoxy and aryloxy groups.

20. The device of claim 19 wherein $Z^A$ and $Z^b$ are F.

21. The device of claim 14 wherein the dopant is present in an amount of up to 10 wt % of the host.

22. The device of claim 21 wherein the dopant is present in an amount of 0.1–5.0 wt % of the host.

23. The device of claim 1 wherein the boron compound is selected from the following:

Inv-1
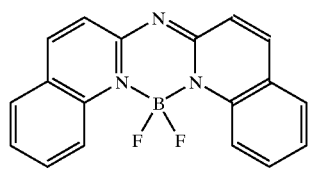

Inv-2
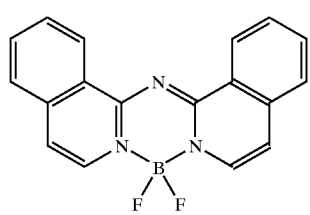

Inv-3
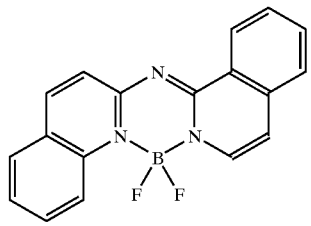

Inv-4
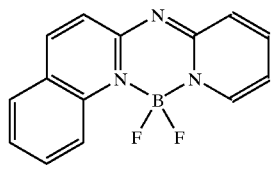

Inv-5
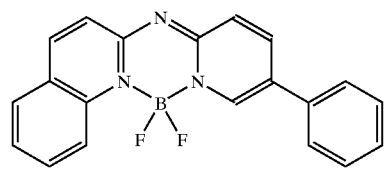

Inv-6
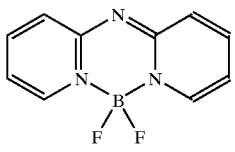

Inv-7
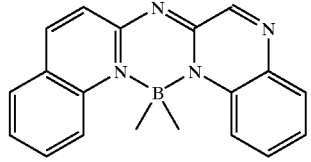

Inv-8
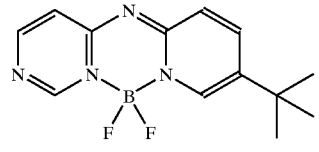

Inv-9
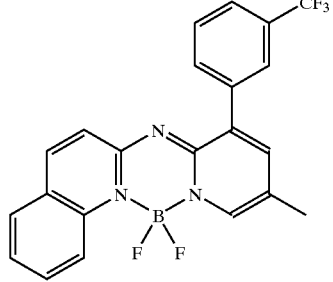

Inv-10
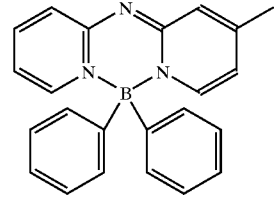

Inv-11
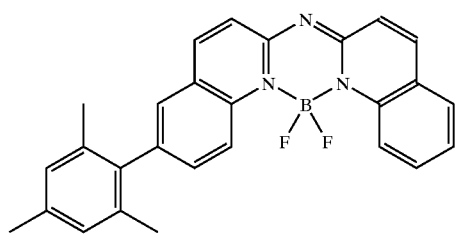
Inv-12
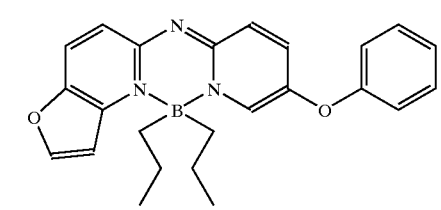
Inv-13
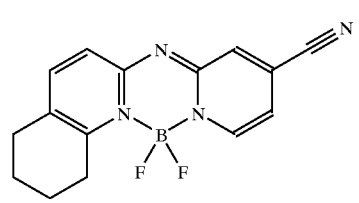
Inv-14
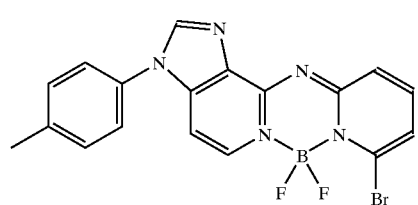
Inv-15
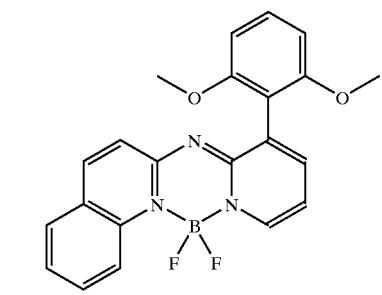
Inv-16
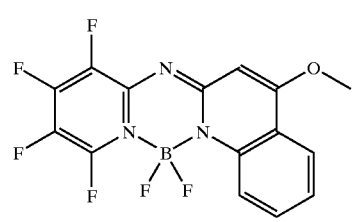
Inv-17
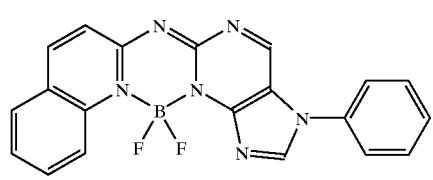
Inv-18
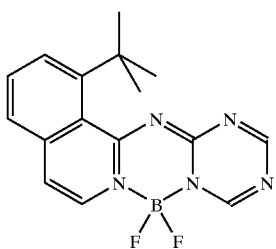
Inv-19
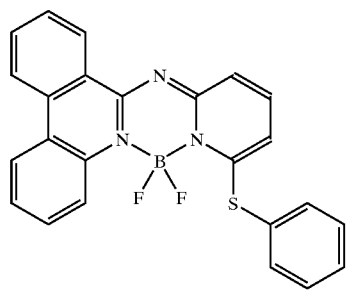
Inv-20
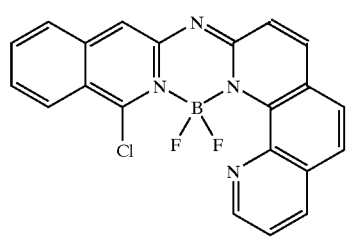
Inv-21
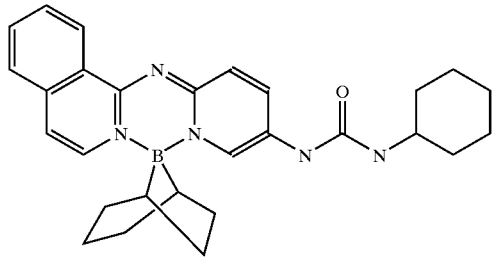
Inv-22
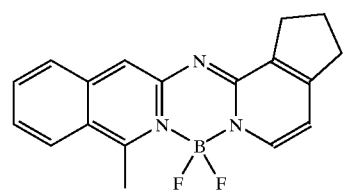
Inv-23
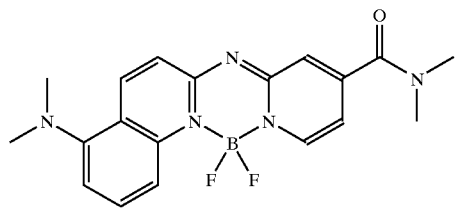
Inv-24
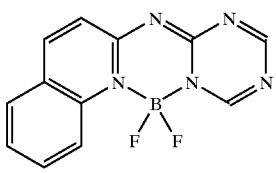

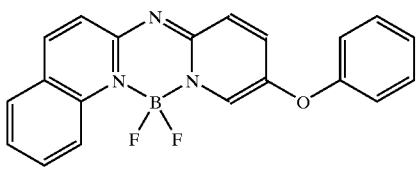
Inv-25

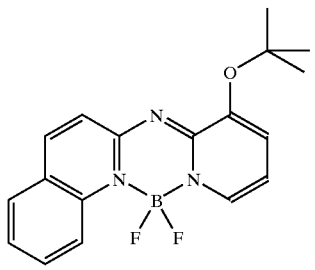
Inv-26

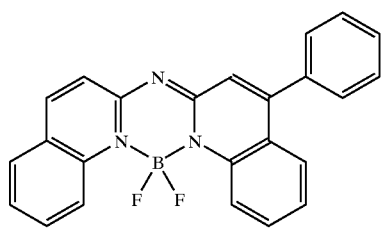
Inv-27

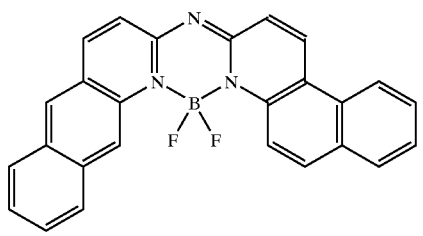
Inv-28

24. The device of claim 1 wherein the boron compound is selected from the following:

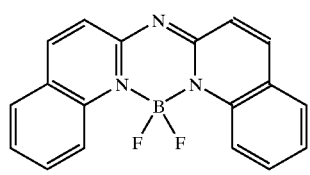
Inv-1

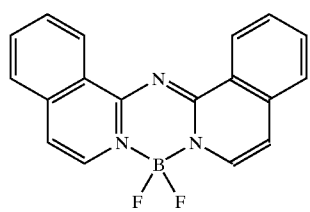
Inv-2

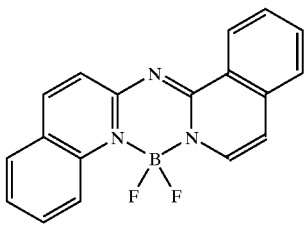
Inv-3

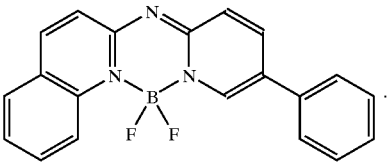
Inv-5

25. A light emitting device containing the OLED device of claim 1.

26. A method of emitting light comprising subjecting the device of claim 1 to an applied voltage.

27. The device of claim 1 wherein the two ring nitrogens are members of different 6—6 fused ring systems in which at least one of the systems contains an aryl or heteroaryl substituent group.

28. The device of claim 27 wherein the two fused ring systems are quinoline or isoquinoline systems.

29. The device of claim 27 wherein the aryl or heteroaryl substituent is a phenyl group.

30. The device of claim 14 wherein there are present at least two $X^a$ groups and two $X^b$ groups which join to form 6—6 fused ring groups with A and A', respectively.

31. The device of claim 30 wherein the fused ring groups are fused at the 1-2, 3-4, 1'-2', or 3'-4' positions, respectively.

32. The device of claim 31 wherein two $X^a$ and two $X^b$ groups separately join to form two quinoline or isoquinoline fused ring systems.

33. The device of claim 32 wherein the fused ring systems are fused at the 1-2 or 3-4, and 1'-2' or 3'-4' positions, respectively.

34. The device of claim 30 wherein at least one of the 6—6 fused ring groups is substituted by an aryl or heteroaryl group.

35. The device of claim 34 wherein a 6—6 fused ring group is substituted by a phenyl group.

36. The device of claim 33 wherein one or both of the 6—6 fused ring groups is substituted by an aryl or heteroaryl group.

37. The device of claim 33 wherein one or both of the 6—6 fused ring groups is substituted by a phenyl group.

38. The device of claim 14 wherein

A and A' represent independent azine ring systems corresponding to 6-membered aromatic ring systems containing at least one nitrogen;

each $X^a$ and $X^b$ is an independently selected substituent, two of each of which join to form rings B and B' as fused rings to rings A and A', respectively, wherein ring A, A', B, or B' comprises an aryl or heteroaryl substituent group;

m and n are independently 2 to 4;

$Z^a$ and $Z^b$ are independently selected substituents; and 1, 2, 3, 4, 1', 2', 3', and 4' are independently selected as either carbon or nitrogen atoms.

39. The device of claim 38 wherein the dopant is one where rings A/A' and B/B' are fused at the 1-2/1'-2', 1-2/3'-4', or 3-4/3'-4' positions, respectively.

40. The device of claim 38 wherein $Z^a$ and $Z^b$ are fluorine.

41. The device of claim 38 wherein the dopant is depicted in formula (2), (3), or (4):

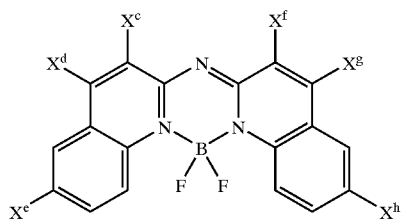

(2)

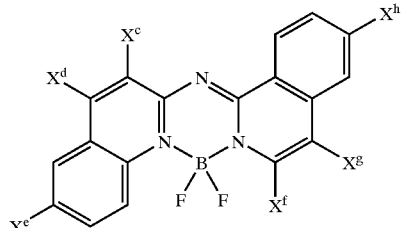

(3)

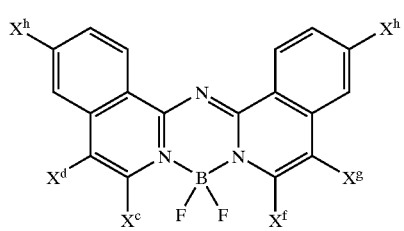

(4)

wherein each $X^c$, $X^d$, $X^e$, $X^f$, $X^g$, and $X^h$ is hydrogen or an independently selected substituent, one of which must be an aryl or heteroaryl group.

42. The device of claim 27 wherein the dopant is present in an amount of up to 10 wt % of the host.

43. The device of claim 27 wherein the dopant is present in an amount of 0.1–5.0 wt % of the host.

44. The device of claim 38 wherein the boron compound is selected from the following Inv-29 through Inv-37.

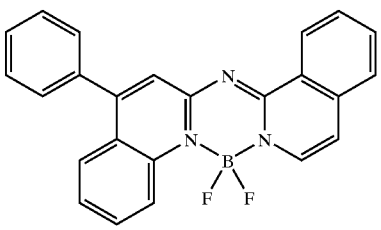

Inv-29

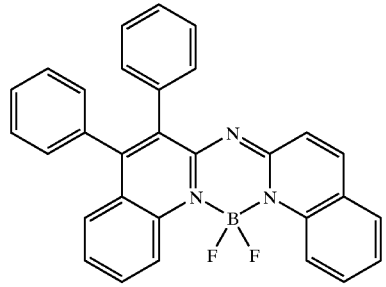

Inv-30

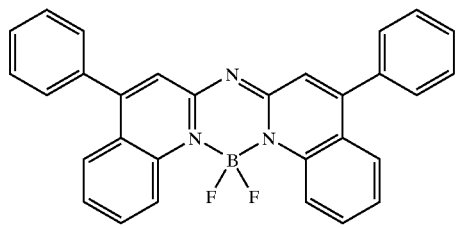

Inv-31

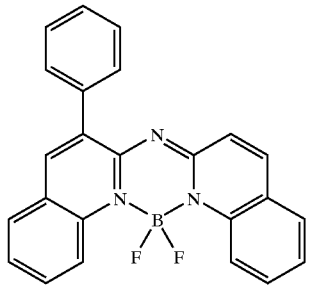

Inv-32

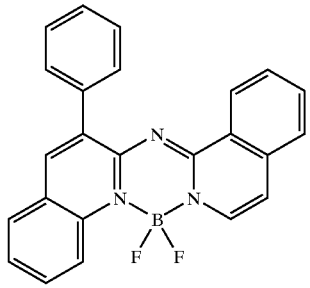

Inv-33

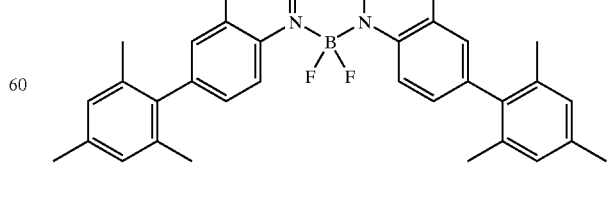

Inv-34

-continued

Inv-35

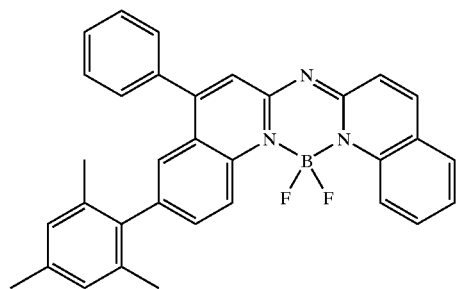

Inv-36

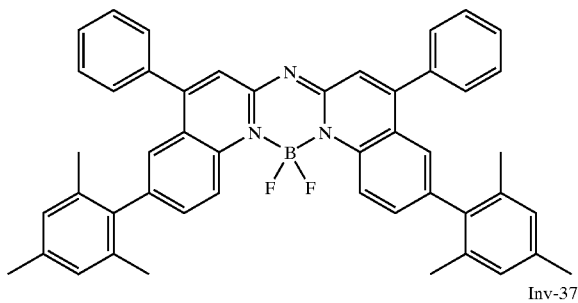

Inv-37

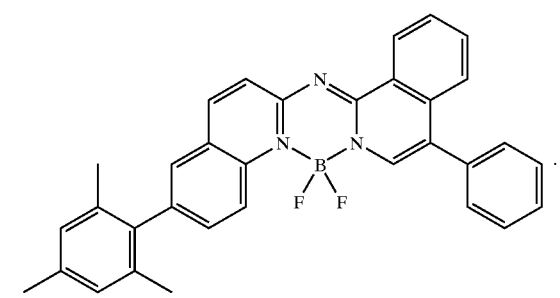

45. A compound represented by Formula (1):

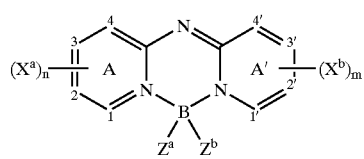

(1)

wherein

A and A' represent independent azine ring systems corresponding to 6-membered aromatic ring systems containing at least one nitrogen;

each $X^a$ and $X^b$ is an independently selected substituent, two of which join to form a fused ring group to ring A or A', respectively, and wherein the fused ring group comprises an aryl or heteroaryl substituent group;

m and n are independently 0 to 4;

$Z^a$ and $Z^b$ are independently selected halides; and 1, 2, 3, 4, 1', 2', 3', and 4' are independently selected as either carbon or nitrogen atoms.

46. The compound of claim 45 which provides a luminescence maximum emission in the range 400–500 nm.

47. A compound represented by Formula (1):

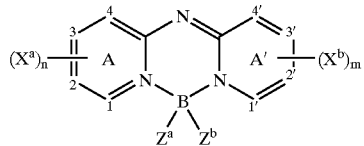

(1)

wherein

A and A' represent independent azine ring systems corresponding to 6-membered aromatic ring systems containing at least one nitrogen;

each $X^a$ and $X^b$ is an independently selected substituent, at least one pair of which join to form a ring fused to ring A or A' at the 3-4 or 3'-4' position;

m and n are independently 0 to 4;

$Z^a$ and $Z^b$ are independently selected halides; and 1, 2, 3, 4, 1', 2', 3', and 4' are independently selected as either carbon or nitrogen atoms.

48. The compound of claim 47 which provides a luminescence maximum emission in the range 400–500 nm.

49. The device of claim 1 in which the boron compound is complexed by at least one ring nitrogen that is a member of a quinoline ring.

50. The device of claim 1 in which the boron compound is complexed by two ring nitrogen that are each a member of a quinoline ring.

51. The device of claim 14 in which at least one $X^a$ or one $X^b$ represents a phenyl ring fused to ring A or A'.

52. The device of claim 51 wherein $Z^a$ and $Z^b$ are F.

53. The device of claim 14 in which an $X^a$ and an $X^b$ represent a phenyl ring fused to rings A and A', respectively.

54. The device of claim 51 wherein $Z^a$ and $Z^b$ are F.

55. The device of claim 1 in which the boron compound is selected from the following:

Inv-1

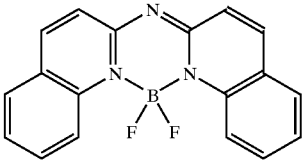

Inv-2

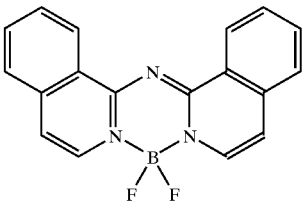

Inv-3

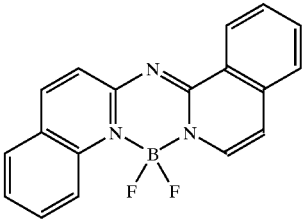

-continued

Inv-4
Inv-5
Inv-7
Inv-9
Inv-11
Inv-15
Inv-16

-continued

Inv-17
Inv-18
Inv-20
Inv-21
Inv-22
Inv-23
Inv-24

-continued

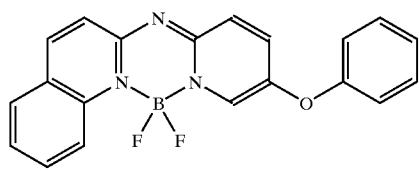
Inv-25

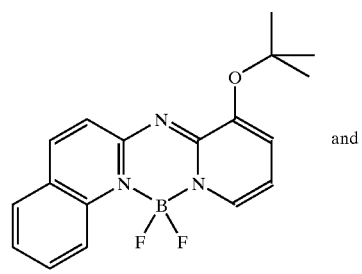
and
Inv-26

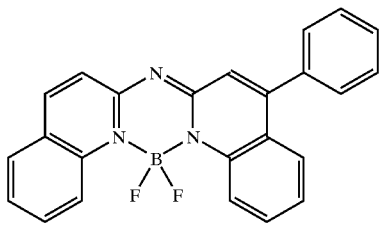
Inv-27

56. The compound of claim 45 in which at least one $X^a$ or one $X^b$ represents a phenyl ring fused to ring A or A' to form a quinoline ring.

57. The compound of claim 56 wherein $Z^a$ and $Z^b$ are F.

58. The compound of claim 45 in which an $X^a$ and an $X^b$ represent a phenyl ring fused to rings A and A', respectively, to form quinoline rings.

59. The compound of claim 58 wherein $Z^a$ and $Z^b$ are F.

* * * * *